United States Patent [19]

Shimizu et al.

[11] Patent Number: 4,991,056
[45] Date of Patent: Feb. 5, 1991

[54] CASE FOR ELECTRONIC UNITS

[75] Inventors: Norio Shimizu; Yuichi Watanabe; Hitoshi Manta, all of Tokyo, Japan

[73] Assignee: Koyo Electronics Industries Co., Ltd., Tokyo, Japan

[21] Appl. No.: 413,878

[22] Filed: Sep. 28, 1989

[30] Foreign Application Priority Data

Sep. 29, 1988 [JP] Japan .............................. 63-126217[U]
Sep. 29, 1988 [JP] Japan .............................. 63-126218[U]
Oct. 31, 1988 [JP] Japan .............................. 63-141212[U]

[51] Int. Cl.$^5$ .......................... H02B 1/08; H05K 7/00
[52] U.S. Cl. ....................................... 361/380; 174/51; 361/395
[58] Field of Search .................. 324/156; 364/708; 174/51; 361/331, 334, 356, 380–383, 390–395, 415, 424, 426, 427

[56] References Cited

U.S. PATENT DOCUMENTS 4,821,145  4/1989  Corfits ................................. 174/51
4,932,051  6/1990  Karan .................................. 361/426

FOREIGN PATENT DOCUMENTS 59-49203  4/1984  Japan .
63-199306  12/1988  Japan .

Primary Examiner—Gerald P. Tolin
Attorney, Agent, or Firm—Michael N. Meller

[57] ABSTRACT

A case is provided for electronic units forming an electronic equipment such as a programmable controller. The case includes a box-type case proper for containing a printed circuit board having connectors to form an electronic circuit, a panel including a terminal board mounting portion and an indicator section for displaying preset values, an indicator section cover for covering a part of the indicator section of the panel, and a cover for covering the upper part of the panel whereby these components are easily combined without using screws or the like. Also, a marking sheet having a color which differs for different types of units can be mounted on the panel. Further, when used as the case for ordinary electronic units, a ground terminal fitting is attached to the back surface of the case proper in manner that the ground terminal fitting is connected to a ground member of a printed circuit board contained in the case proper, and mounting the case on a mother board connects the ground terminal fitting to a ground terminal formed on the mother board.

3 Claims, 7 Drawing Sheets

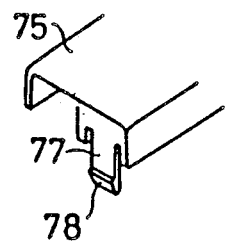
Fig. 2-(b)
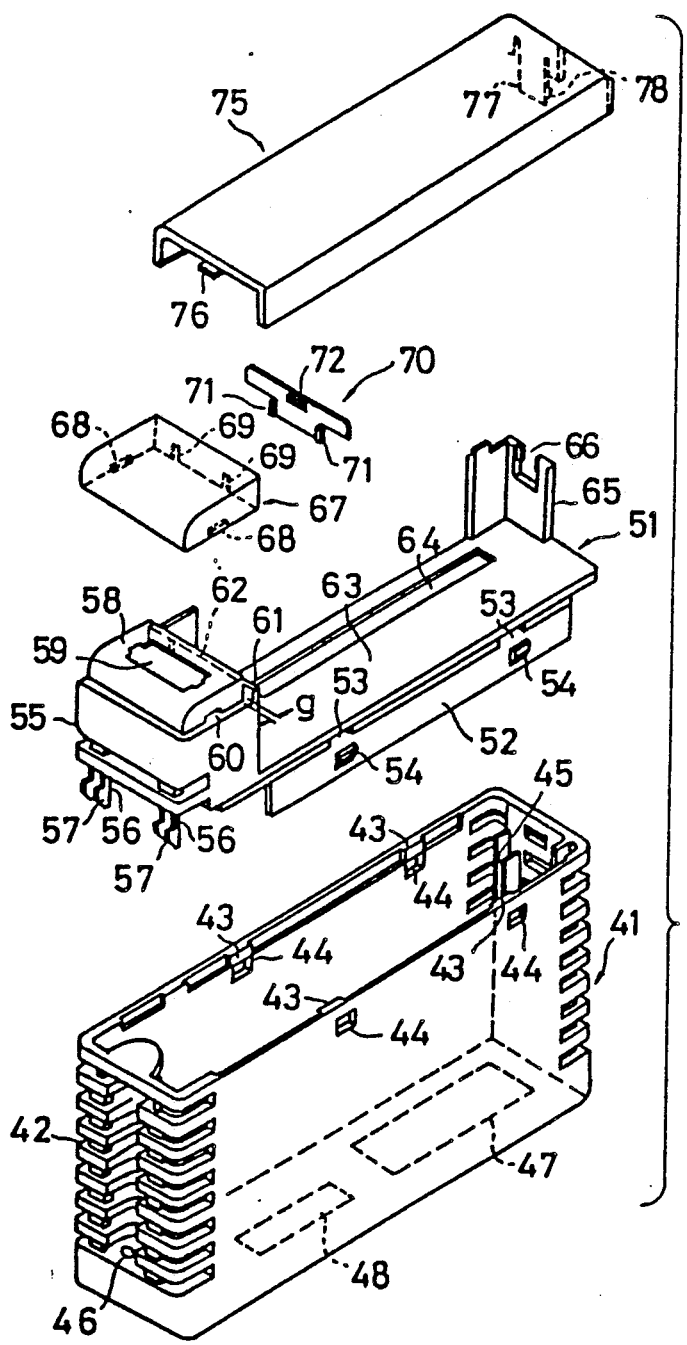
Fig. 2-(a)

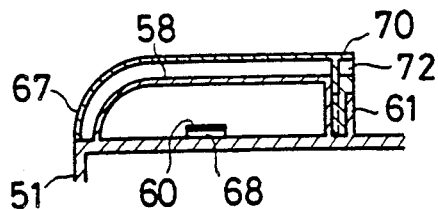
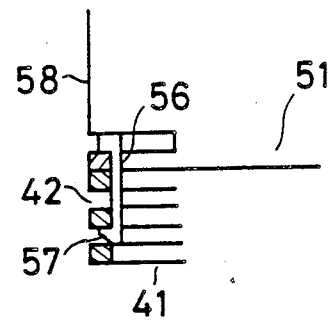
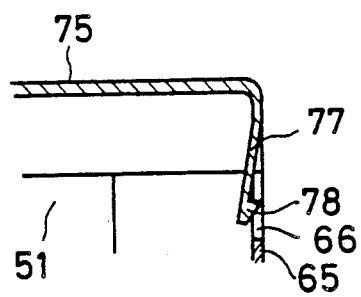
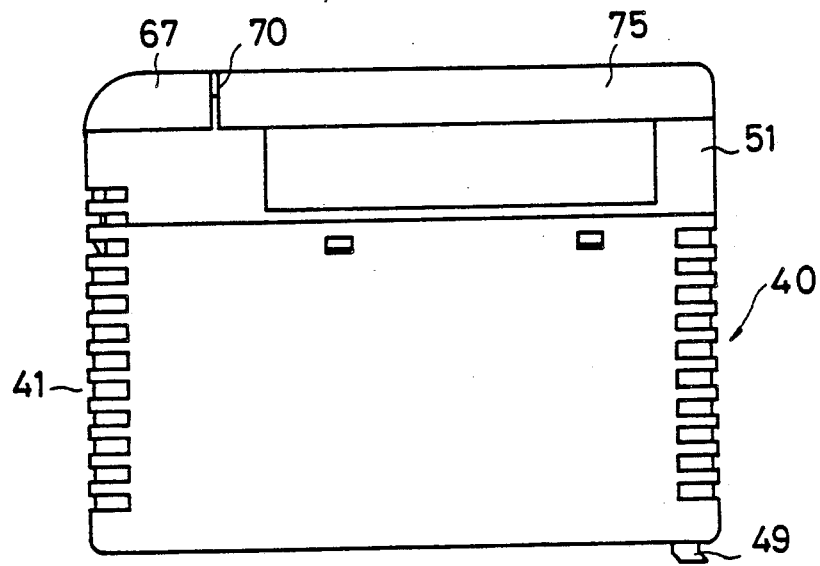

Fig. 5-(a)
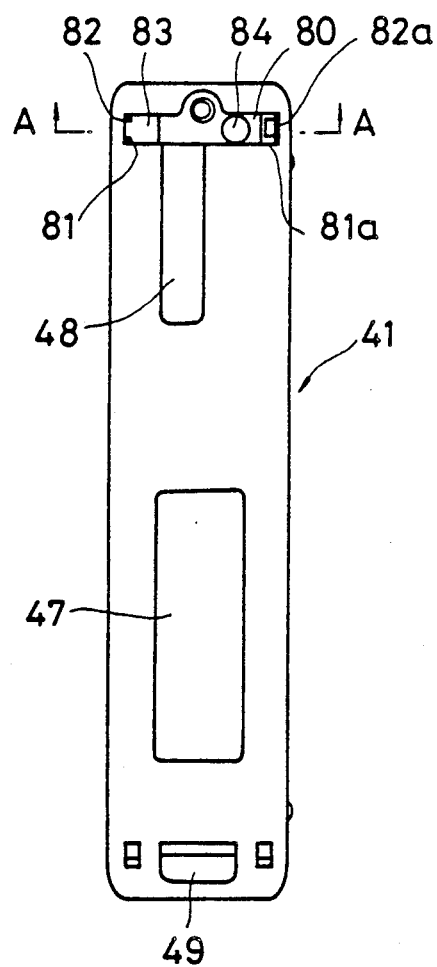
Fig. 5-(b)
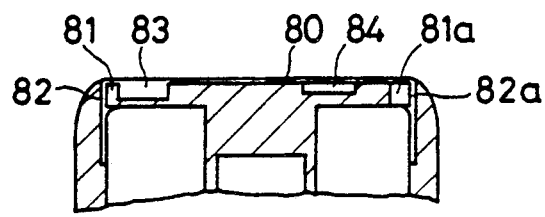

Fig. 6-(a)
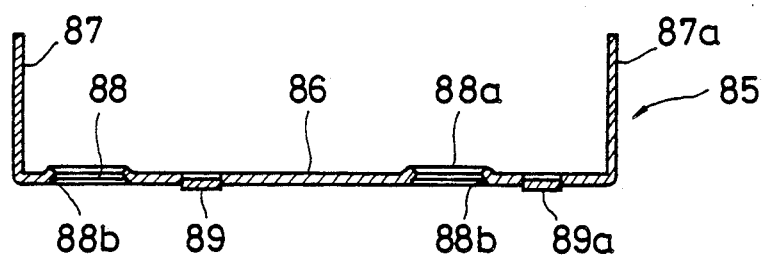
Fig. 6-(b)
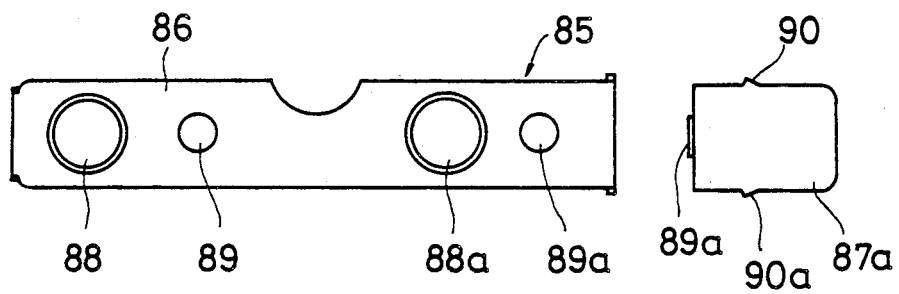

CASE FOR ELECTRONIC UNITS

BACKGROUND OF THE INVENTION

1. Field of the Invention

The present invention relates to a case for electronic units and more particularly to a case for electronic units which is especially effective when used as a case for such units as input units, output units and a CPU unit forming a programmable controller.

2. Description of the Prior Art

Referring to FIG. 9, there is illustrated a perspective view showing a conventional programmable controller (hereinafter referred to as a PC) by way of example. In the Figure, numeral 1 designates a box-type case made from a synthetic resin material and opened at its front face, 2 a power supply unit inserted in the case 1, and 3 a CPU Unit screwed to the case 1 to adjoin the power supply unit 2, with control program setting means 5 (hereinafter referred to as setting means) including a connector 6 adapted for connection to a connection portion 4 of the CPU unit 3 being mounted on the power supply unit 2 and the CPU unit 3 and fixed in place with screws. Numeral 7 Designates input units, and 8 output units. The front panels of these units are screwed to the case 1 in juxtaposition to the CPU 3, and each of the units 7 and 8 includes a terminal board 9 and a signal indicator 10 which are arranged on the front panel for connection to a controlled system and a printed wiring board 11 which is attached to the back of the front panel and formed with the necessary electric circuit connected to a mother board (not shown) arranged at the bottom of the case 1.

With the PC including the above-mentioned component units, the necessary control program is preliminarily selected by the setting means 5 and it is stored in the CPU 3. The input signals from the controlled systrem are applied to the input units 7 and processed by the CPU unit 3 so that in accordance with the processing results, control signals are generated from the output units 8 thereby controlling the controlled system in accordance with the selected program.

While the PC has an excellent control function as mentioned above and it is presently used in a wide range of applications in the industrial world, it has the following disadvantages.

(1) The power supply unit 2, the CPU unit 3, the setting means 5, the input units 7 and the output units 8, forming the PC, are all contained in the case 1 and the numbers of these units (particularly the input units 7 and the output units 8) are varied in dependence on the intended use, the controlled system, etc. Therefore, cases 1 of various sizes (lengths) corresponding to such varying number must be prepared thus not only making the PC uneconomical but also increasing its cost.

(2) Since the input units 7 and the output units 8 are practically the same in external appearance thus making it difficult to draw a distinction therebetween and there is the danger of these units being mounted erroneously or operated erroneously. As a result, the types of units are indicated by letters, symbols or the like on the front panels or the whole or part of each front panel is painted in a different color by printing or the like in correspondence to the type of the unit and the inscription of letters or the like or the coloring operation is troublesome thus causing an increase in the cost and a problem from the design point of view.

(3) Since each of the units is fastened to the case 1 with two or more screws, the dismounting and mounting operations are very troublesome not only during the assemblage but also during the maintenance, inspection, repair, etc., thus requiring considerable time.

(4) The case 1 is generally made by molding a synthetic resin and it expands and contracts in response to temperature changes. On the other hand, attached to the bottom of the case 1 is the mother board made from a glass epoxy resin or the like which does not practially expand and contract in response to temperature changes and the printed wiring board of each unit is connected to the mother board through the connector. As a result, the case is expanded and contracted with changes in the ambient temperature thereby causing troubles between the mother board and the printed wiring boards.

(5) The terminal boards 9 and the printed wiring boards 11 provided on the input and output units 7 and 8 are exposed and thus dust and dirt tend to deposit on them thereby giving rise to the danger of causing any contact failure or short-circuit.

(6) If any particular unit is removed for the purpose of maintenance, inspection, adjustment or the like, a space is left in this portion so that there is the danger of the dust and dirt entering the case 1 through this space and causing any contact failure, short-circut or the like.

(7) The connecting operation of the ground terminals of the input and output units is troublesome, particularly where such units are mounted with greater density, the number of ground terminals is increased thus not only the cost is increased but also a considerable time is required for their connecting operation.

SUMMARY OF THE INVENTION

The present invention has been made with a view to overcoming the foregoing deficiencies in the prior art and it is an object of the present invention to provide a case for electronic units so designed that the component parts of each unit are contained in a case and the case is mounted on a base board, thereby eliminating the use of the conventional case and making it possible to effect its assembling, maintenance and inspection easily in a short period of time.

It is another object of the present invention to provide such case for electronic units so designed that during the assembling of the case, a simple marking sheet is added to make it possible to easily discriminate the type of unit and make the case excellent from the design point of view.

It is still another object of the present invention to provide a ground structure for electronic units which is simple in construction and capable of connecting a ground terminal by a single touch.

In accordance with one aspect of the present invention, there is thus provided a case for electronic units including a box-type case proper having an opening at its front and engaging holes in the side walls and at least one of the vertial walls in the vicinity of the opening, a panel including an indicator section formed on one side of its upper surface, a locking portion formed on the other side of the upper surface, a terminal board mount between the indicator section and the locking portion, a plurality of locking pieces depending from the lower part of the indicator section and a plurality of projections formed on the lower sides of the terminal board mount so as to engage with the engaging holes of the case proper, an indicator section cover placed to cover a part of the indicator section of the panel, and a cover including a projection formed at iys one end to fit in hole formed in the indicator section of the panel or the indicator section cover and a locking piece formed on the power side of its other end so as to engage with the locking portion of the panel.

In accordance with another aspect of the present invention, the case further includes a marking sheet having a color which differs for different types of units and interposed between the indicator section of the panel and the cover.

In accordance with still another aspect of the present invention, the case includes a case proper having a plurality of slots formed at given intervals in its back surface and a hole formed between the slots, a ground terminal fitting including a body formed with an engaging hole at a position corresponding to the hole of the case proper and a pair of leg portions formed at the ends of the body so as to be inserted into the slots of the case proper, and a ground member a mounted on a printed wiring board inserted in the case proper and positioned near by the hole in the case proper whereby the leg portions of the ground terminal fitting are fitted in the slots of the case proper and a screw inserted through the engaging hole of the ground terminal fitting is threaded into the threaded hole formed in the ground member through the hole formed in the case proper.

The case for electronic units according to the present invention has the following features.

The indicator section cover is mounted on the indicator section and the terminal board is mounted on the terminal board mount. Then, the panel having the printed wiring board mounted on its lower surface is fitted in the opening of the case proper thus forming an integral unit. Then, the cover is fitted on the panel.

Also, the marking sheet having a color which differs for different types of units is interposed with the result that the type of the unit can be easily distinguished externally and there is no danger of causing any erroneous mounting or erroneous operation.

Further, the leg portions of the ground terminal fitting are inserted into the slots formed in the back of the case properthuse aligning its engaging hole with the hole formed through the case proper, and then the screw is inserted through the engaging hole to threadedly fit in the threaded hole of the ground member thereby combining the ground terminal fitting, the screw and the ground member as a unit.

BRIEF DESCRIPTION OF THE DRAWINGS

FIGS. 2a And 2b are respectively an exploded perspective view of an embodiment of the present invention and a perspective view showing the back of the cover.

FIGS. 3a, 3b and 3c are respectivley a sectional view showing the combined condition of the indicator section cover and the marking sheet, a sectional view showing the locked condition of the panel locking pieces and the case proper and a sectional view showing the locked condition of the cover locking piece and the case proper.

FIG. 4 is a side view showing the assembled condition of the embodiment of the invention.

FIGS. 5a and 5b are respectivley a back view showing another embodiment of the present invention and a sectional view taken along the line A—A of FIG. 5a.

FIGS. 6a, 6b and 6c are respectiveley a sectional view of the ground terminal fitting forming an essential part of the second embodiment, a plan view thereof, and a side view thereof.

DESCRIPTION OF THE PREFERRED EMBODIMENTS

Figure 1:
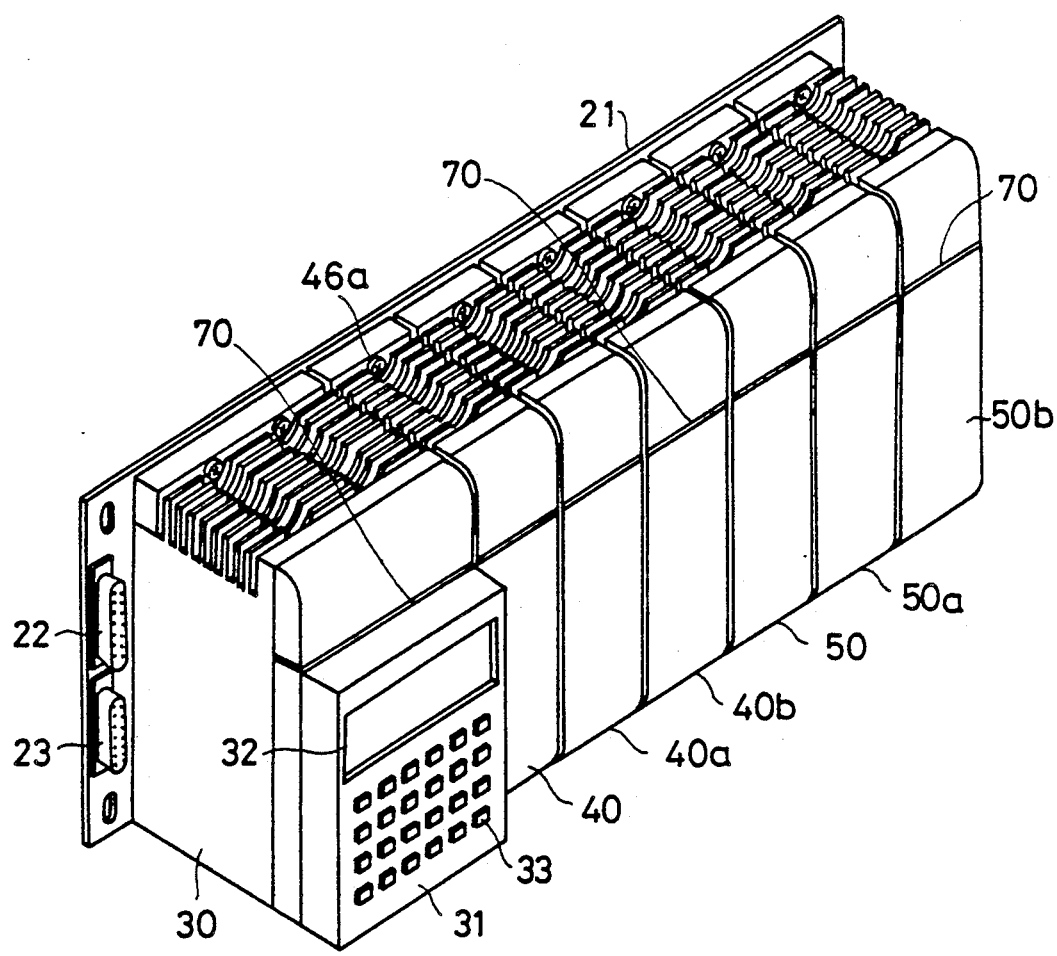
FIG. 1 is a perspective view showing an example of a PC incorporating a case for electronic units according to the present invention.

Referring to FIG. 1, there is illustrated a perspective view of an example of a PC in corporating a case for electronic units according to the present invention. In the Figure, numeral 21 designates a base board including a mother board comprising a printed wiring board, connectors to which are connected the printed wiring boards of respective units (both of them are not shown) and connectors 22 and 23 for electrical connection with other electronic controllers of the same type. Numeral 30 designates a unit containing a power supply unit and a CPU unit (hereinafter referred to as a CPU unit), 31 control program setting means fixedly mounted on the surface of the CPU unit 30, 32 an indicating window, and 33 setting keys. Numerals 40 to 40b designate input units mounted on the base board 21 in juxtaposition to the CPU unit 30, and 50 to 50b output units mounted on the base board 21 in juxtaposition to the input units 40 to 40b. Numeral 70 designate marking sheets for indicating the types of units of the CPU unit 30, the input units 40 to 40b and the output, units 50 to 50b, and the marking sheets are colored differently (for example, white for the CPU unit 30, blue for the input units 40 to 40b and red for output units 50 to 50b) the units 40 to 40b and the units 50 to 50b use the cases of the same type and therefore the input unit 40 will now be explained in greater detail.

Referring to FIG. 2 there is illustrated an exploded perspective view showging an embodiment of a case for electronic units according to the present invention. In the Figure, numeral 41 designates a box-type case proper which is opened at its front and including radiation holes 42 at its longitudinal ends engaging projections 43 formed on the inner sides of the opening-side side walls to project therefrom, and engaging holes formed at positions below the engaging projections. Numeral 45 designates a printed wiring board guide groove formed on the inner side of the rear vertical wall of the case proper 41. This guide groove may be formed on the front vertical wall or the bottom of the case proper 41. Numerals 47 and 48 designate window holes formed in the bottom of the case proper 41 to receive connectors which are mounted on an printed wiring board that will be described later and connected to the mother board of the base board 21.

Numeral 51 designates a panel including a pair of guide plates 52 (only one of them is shown in the Figure) formed on the sides of its lower surface to depend therefrom so as to be fitted in the opening of the case proper 1, and formed on the outer surface of each guide plate 52 are notches 53 for engagement with the engaging projections 43 of the case proper 41 and projections 54 for engagement with the engaging holes 44 of the case proper 41. Although not shown, a printed circuit board is fixed ot the inner sides of the guide plates 52. Numeral 55 designates an indicator section formed at its one end with lock pieces 56 each having a lock pawl 57 hanging down from its forward end. Numeral 58 designates an indicator chamber formed on the upper surface of the indicator section 55 to contain light-emitting diodes, numerical displays or the like and including an indicating window 59 in its upper surface and a fitting hole 60 in each of its side walls. Numeral 61 designates a vertical wall serving as a boundary between the indicator section 55 and a terminal board mount 63 which will be described later. The vertical wall 61 is lower than the indicator chamber 58 and its central portion, on the side of the indicator chamber 58, is cut to form a recess 62. Also, a gap g is formed between the vertical wall 61 and the indicator chamber 58. Numeral 63 designates the terminal board mount, and 64 an elongated hole for introducing the wires from the terminal board into the case proper 41. Numeral 65 designates a vertical wall arranged on the rear portion of the terminal board mount 63 and formed with a locking hole 66 cut into a convex shape.

Numeral 67 designates an indicator section cover made from a light transmitting material and furnished with numerals or signals for indicating the state of any signal indicated by the indicator. Also lock portions 68 are formed on the inner sides of the indoicator section cover 67 to project therefrom for fitting into the fitting holes 60 of the indicator chamber 58 and also its rear vertical wall is formed with notched holes 69. Numeral 70 designates a T-shaped marking sheet for distinguishing the input unit 40, the output unit 50 and the CPU unit 30 from one another, and it includes projections 71 formed on one side thereof so as to be fitted in the notched holes 69 of the indicator section cover 67 and a hole 72 formed through its upper central portion. The marking sheet 70 has a color such as red, blue or white to show the classification such as the unit 30, 40, or 50.

Numeral 75 designates a cover having a channel shape in section and it includes a projecting piece 76 formed at its one end so as to be fitted into the hole 72 of the marking sheet 70 and a locking piece 77 formed at its other end, having resilience and provided at its forward end with a locking pawl 78 as shown in FIG. 2(b) for engagement with the locking hole 66 formed in the vertical wall 65 of the panel 51.

With the construction described above, an example of the assemblage of the case according to the present invention will now be described.

(1) A numerical indicator or the like is inserted from below into the indicator section 55 of the panel 51 and the indicator section 55 is fixed in place at the position of the indicator window 59. Then, the indicator section cover 67 is fitted onto the indicator chamber 58. In this case, if the rear vertical wall of the indicator section cover 67 is inserted in the gap g formed by the indicator chamber 58 and the vertical wall 61 and pressed down, the lock portions 68 are fixedly fitted into the fitting holes 60 (see FIG. 3(a)).

(2) The leg portion of the marking sheet 70 is inserted in to the recess 62 of the vertical wall 61 and its projections 71 are engaged with the notched holes 69, of the indicator section cover 67. At this time, the top of the marking sheet 70 is positioned in substantially the same plane as the upper surface of the indicator section cover 67 (See FIG. 3(a)).

(3) A terminal board (not shown) is arranged on the terminal board mount 63 and fixed in place with screws. Also, a printed wiring board (not shown) is mounted on the lower surface of the panel 51.

(4) With the various components mounted on it in the above-mentioned manner, the panel 51 is mounted in the opening of the case proper 41. At this time, the printed wiring board mounted on the panel 51 is lowered along the guide groove 45 formed in the case proper 41 so that the projections 54 are locked in the locking holes 44 and the notches 53 are engaged with the locking projections 43. Also, as shown in FIG. 3(b), the lock pawls 57 of the locking pieces 56 engage with the radiation holes 42, thereby integrally combining the two by a single touch.

At this time, the connectors arranged on the printed wiring board and connected to the connectors arranged on the mother board of the base board 21, are respectively exposed to the outside through the window holes 47 and 48 formed in the bottom of the case proper 41.

(5) Lastly, the projecting piece 76 of the cover 75 is inserted through the hole 72 of the marking sheet 70 and its other end is pressed down, thus locking the locking piece 78 in the convex locking hole 66 as shown in FIG. 3(c) and thereby fastening the cover 75 to the panel 51.

Thus, the assembling of the input unit 40 shown in FIG. 4 is completed (any explanation of its wiring is omitted).

In FIG. 4, numeral 49, designates a lock portion formed on the lower surface of the case proper 41 to project therefrom for fitting in the engaging portion of the base board 21.

The input units 40 constructed as described above can be mounted on the base board 21 by simply arranging them in order by the type of unit in accordance with the color of the marking sheets 70 displayed at the front faces of cases 40 (for example, white represents the CPU unit 30, blue the input units 40 to 40b and red the output units 50 to 50b) locking the lock portion 49 formed on the lower surface of each case proper 41 according to the type of unit in the hole formed in the base board 21 and pressing it against the hole, inserting screws 46a into holes 46 formed below the radiation holes 42 and threading the screws into the threaded holes of the base board 21. In this way, the desired units can be mounted at the given positions of the base board 21.

Also, to connect the wires and the like to the terminal board mounted on the panel 51 only requires that with the input unit 40 mounted on the base board 21, the locking piece 77 of the cover 75 is pressed to disengage with the locking hole 66 and thereby to detach the cover 75 from the panel 51. To effect the maintenance or replacement of the printed wiring board and the like, it is only necessary to remove the panel 51 from the case proper 41.

Further, to remove the input unit 40 from the base board 21 and disassemble it only requires that the previously mentioned operation is performed in the reverse order.

FIGS. 5(a) and 5(b) show another embodiment of the present invention, with FIG. 5(a) showing a back view of the case proper 41 and FIG. 5(b) an enlarged sectional view takin along the line A—A of FIG. 5(a). In the Figures, numeral 80 designates a recess formed in the back surface of the case proper 41 on one side thereof, (on the side of the indicator section 55 in this embodiment) and slots 82 and 82a are respectively formed between the inner sides of the side walls of the case proper 41 and projections 81 and 81a. Also, a hole 83 is formed on one side of the center of the recess 80 and a circular recess 84 is formed on the other side of the center.

FIGS. 6(a), 6(b) and 6(c) are respectively an enlarged sectional view of a ground terminal fitting 85, its plan view and its side view. The ground terminal fitting 85 includes a body 86 and leg portions 87 and 87a formed by bending its ends at substantially right angles so as to be inserted into the slots 82 and 82a, respectively, of the recess 80 of the case proper 41, and the body 86 includes engaging holes 88 and 88a having their peripheral edges projected inwardly (to the side of the leg portions 87 and 87a, respectively) and positioned to respectively align with the hole 83 and the recess 84 in the recess 80 of the case proper 41. Numeral 88b designates an inclined surface formed at the inner edge of each of the engaging holes 88 and 88a, and 89 and 89a contacts projected from the outer surface of the body 86 to contact with the ground wiring of the mother board. Numerals 90 and 90b designates lock pawls formed on the sides of each of the leg portions 87 and 87a.

Figure 7:
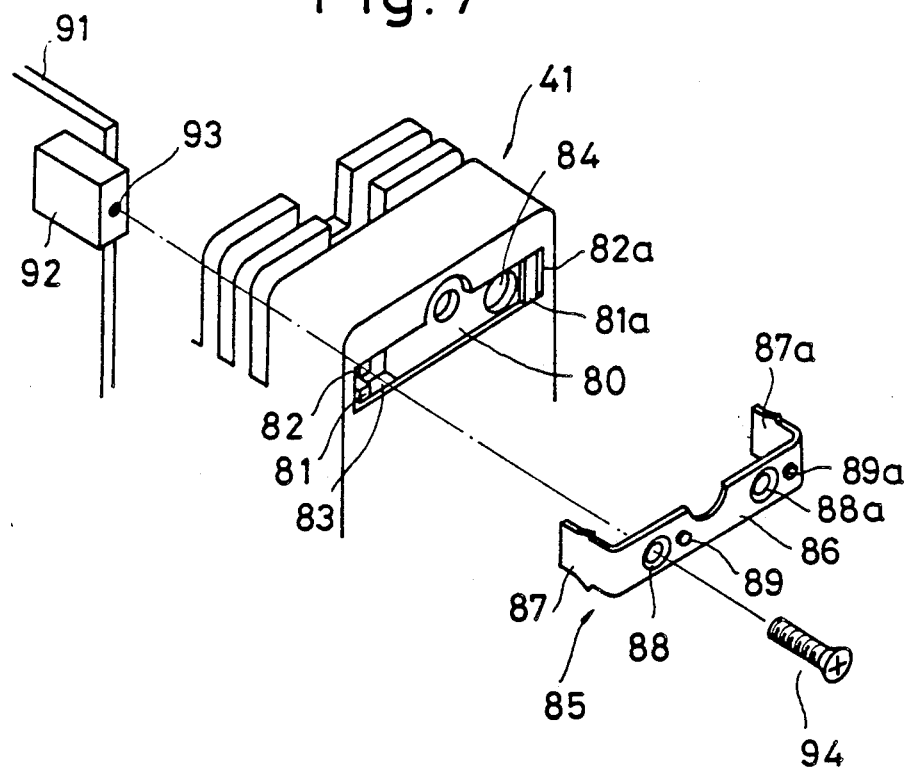
FIG. 7 is an exploded perspective view of the second embodiment.

Referring now to FIG. 7, numeral 91 designates a printed wiring board mounted on the lower surface of the panel 51, and a ground member 92 connected to the grounding wiring pattern formed on the printed wiring board 91 is mounted at a position where it aligns with the hole 83 formed in the recess 80 of the case proper 41 when the printed wiring board 91 is inserted into the case proper 41. Numeral 93 designates a threaded hole formed in the ground member 92.

In the present embodiment constructed as described above, as mentioned previously, the panel 51 having the indicator section cover 67 mounted thereon is first fitted into the case proper 41.

Then, as shown in FIG. 7, the leg portions 87 and 87a of the ground terminal fitting 85 are respectivley inserted into the slots 82 and 82a of the recess 80 formed in the back surface of the case proper 41 and the protruding portions of the engaging holes 88 and 88a are respectivley fitted into the hole 83 and the recess 84, thereby effecting the positioning. At this time, the lock pawls 90 and 90a formed on the leg portions 87 and 87a bite into the side walls of the slots 82 and 82a, thereby firmly fixing the ground terminal fitting 85 in place.

In this condition, a screw 94 is threaded through the engaging hole 88 of the ground terminal fitting 85 such that the screw 94 is threaded into the threaded hole 93 of the ground member 92 which is positioned on the inner side of the hole 83 in the case proper 41, thereby fastening the two together integrally.

Figure 8:
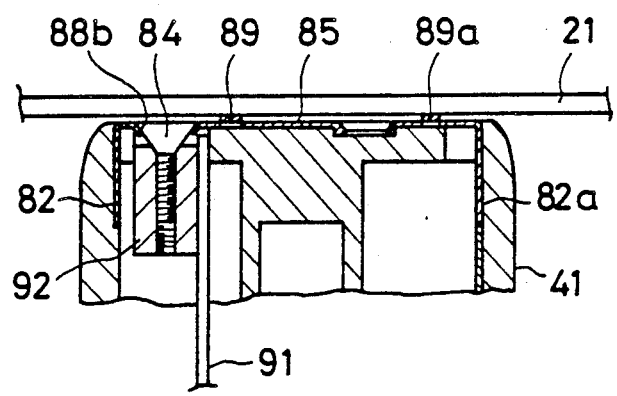
FIG. 8 is a sectional view showing the assembled condition of the second embodiment.
Figure 9:
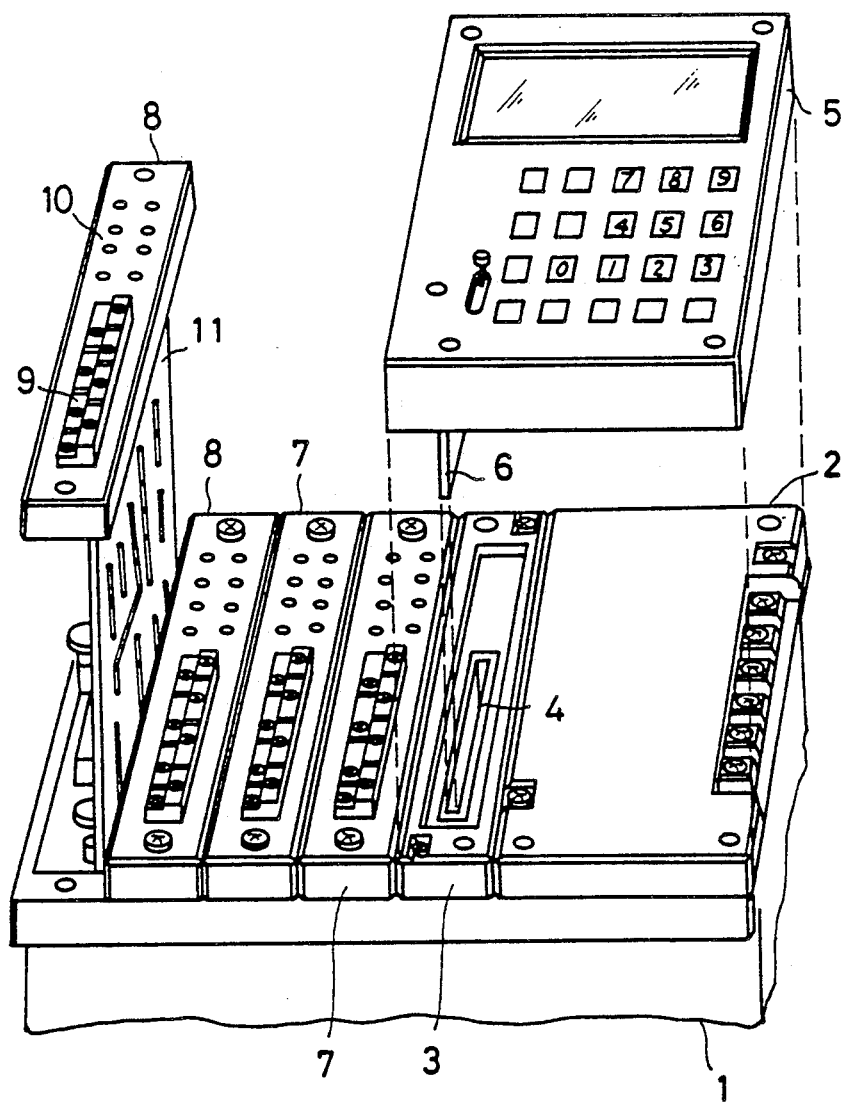
FIG. 9 is a diagram useful for explaining an example of a conventional PC.

The resulting condition is shown in FIG. 8. As will be seen from the Figure, the head of the screw 94 is pressed against the inclined surface 88b of the engaging hole 88 and thus the ground member 92 is positively connected electrically to the ground terminal fitting 85 through the screw 94.

Then, finally the cover 75 is fastened to the pannel 51.

When the input unit constructed as described above is mounted on the base board, the contacts 89 and 89a formed on the ground terminal fitting 85 contact with the ground pattern (not shown) formed on the mother board 21 as shown in FIG. 8, thereby informing a ground circuit including the printed wiring board 91, the ground member 93, the screw 94, the inclined surface 88b of the engaging hole 88, the ground terminal fitting 85, the contacts 89 and 89a and the ground pattern.

While, in the foregoing description, a case for electronic units according to the present invention is used as a case for the input units of a PC, the case can be similarly used as a case for the output inputs and the CPU unit and also it can be mounted as a case for any other electronic units and equipment.

Further, where the marking sheet 70 is not needed, the hole into which the projecting piece 76 of the cover 75 is inserted may be effectively formed in the vertical wall 61 or the indicator section cover 67. Also, where the case proper 41 need not be formed with the radiation holes 42, the holes adapted for engagement with the lock pawls 57 of the locking pieces 56 may be formed in the vertical walls of the case proper 41.

While, in the above-described embodiment, the ground terminal fitting 85 is provided at the end of the back surface of the case proper 41 to extend in the width direction, it may be arranged at any suitable position depending on the position and shape of the printed wiring board 91 to be incorporated.

Still further, while the recess 80 is formed in the back surface of the case proper 41 and the ground terminal fitting 85 is fitted to the recess 80, the recess 80 may be omitted. Also, while the ground terminal fitting 85 is formed with the two engaging holes 88 and 89a each having its edge protruded inwardly, it is possible to use only that engaging hole whose edge fits in the hole 83 of the case proper 41, and the invention is not limited to the number of contacts 89 and 89a. In is to be noted that where the recess 80 not formed in the case proper 41, the contacts may be eliminated.

From the foregoing description it will be seen that the present invention has the following remarkable effects.

(1) Since each of the units is contained in the case and mounted on the base board, there is no need to prepare cases of different sizes in correspondence to different numbers of units as previously, thereby not only enbsuring economy but also reducing the cost.

(2) When making maintenance, inspection, adjustments and the like, it is only necessary to remove the cover or the panel and moreover non-use of anyscrews makes it easy to perform these operations.

(3) Since the numerals, symbols, etc., for representing states of signals indicated by the indicator are provided on the separate indicator seciton cover by such means as printing, the panel can be used in common with the input and output units. This has the effect of reducing the product cost.

(4) During the assembling of the case, the marking sheet of a color which differs for different types of units is added so that it is possible to easily draw a distinction between for example the input and output units which are the same in external appearance but different in type of unit and thus there is no danger of making any erroneous mounting or operation.

(5) since the terminal board is covered by the cover, there is no danger of the deposition of dust and dirt causing any contact failure or short-circuit.

(6) Even if the panel is removed for the purpose of maintenace, inspection, adjustment or the like, only the case of this unit produces an empty space and therefore there is no danger of any dust and dirt entering the other units.

(7) Also, by virtue of the fact that the ground temrinal fitting connected electrically to the ground terminal of the printed wiring board incorporated in the case proper is attached to the back surface of the case proper, when mounting the electronic unit on, the mother board, the ground terminal provided on the mother board and the ground terminal of the electronic unit can be connected by a single touch. This has the effect of greatly reducing the number of man-hours for connecting the ground terminals and the cost as well.

What is claimed is:

1. A case for electronic units comprising:

a box-type case proper including an opening formed at a front thereof, and a plurality of engaging holes formed in both side walls and at least one of the vertical walls thereof in the vicinity of said opening;

a panel including an indicator section portion formed on one side of an upper surface thereof, a locking portion formed on the other side of said upper surfrace, and a terminal board mounting portion formed between said indicator section and said locking portion, a plurality of lock pieces formed on a lower part of said indicator section to depend therefrom, and a plurality of projections formed on each of two lower sides of said terminal board mounting portion for engagement with corresponding ones of said engaging holes of said case proper;

an indicator section cover for covering a part of said indicator section of said panel; and a cover including a projecting piece formed at one end thereof so as to be fitted into a hole formed in said indicator section of said panel or said indicator section cover, and a locking member formed on a lower side of the other side thereof so as to be locked in said locking portion of said panel.

2. A case for electronic units according to claim 1. further comprising a marking sheet having a color which differs for different types of units. said marking sheet being interposed between said indicator section of said panel and said cover.

3. A case for electronic units comprising:

a case proper including a pair of slots formed in a back surface thereof apart from each other by a given distance, and a hole formed therethrough between said slots;

a ground terminal fitting including a pair of leg portions adapted for insertion into the pair of slots of said case proper; and a ground member attached to a printed wiring board adapted for insertion into said case proper, said ground member being positioned nearby said hole of said case proper;

whereby the leg portions of said ground terminal fitting are fitted into the slots of said case proper, and a screw inserted through an engaging hole of said ground terminal fitting is threaded into a threaded hole formed in said ground member through the hole formed in said case proper.

* * * * *